United States Patent [19]

Etzel

[11] Patent Number: 4,655,524
[45] Date of Patent: Apr. 7, 1987

[54] SOLDERLESS CONNECTION APPARATUS
[75] Inventor: Stephen J. Etzel, Woodstock, Conn.
[73] Assignee: Rogers Corporation, Rogers, Conn.
[21] Appl. No.: 689,471
[22] Filed: Jan. 7, 1985
[51] Int. Cl.⁴ .......................................... H01R 11/00
[52] U.S. Cl. ............................ 339/59 M; 339/17 F; 339/61 M; 339/DIG. 3
[58] Field of Search ............... 339/59 R, 59 M, 61 R, 339/61 M, 75, 17 F, 176 MF, DIG. 3

[56] References Cited
U.S. PATENT DOCUMENTS

| | | | |
|---|---|---|---|
| 3,877,770 | 4/1975 | Saunders et al. | 339/17 F |
| 4,255,003 | 3/1981 | Berg | 339/61 M |
| 4,519,659 | 5/1985 | Shiino et al. | 339/59 M |
| 4,575,166 | 3/1986 | Kasdagly et al. | 339/61 M |

FOREIGN PATENT DOCUMENTS 2312183 12/1976 France ........................ 339/DIG. 3

Primary Examiner—Gil Weidenfeld
Assistant Examiner—Paula A. Austin
Attorney, Agent, or Firm—Fishman & Dionne

[57] ABSTRACT

A solderless connector wherein mechanical means applies a force against an elastomeric element to effect electrical contact between terminal portion of printed circuit devices is presented. The solderless connector comprises a flexible circuit sheet which is wrapped around a compressible element to provide exposed contact pads and is especially well suited to connect a leadless electronic package, i.e., chip carrier or leadless DIP package, to a circuit board.

18 Claims, 6 Drawing Figures

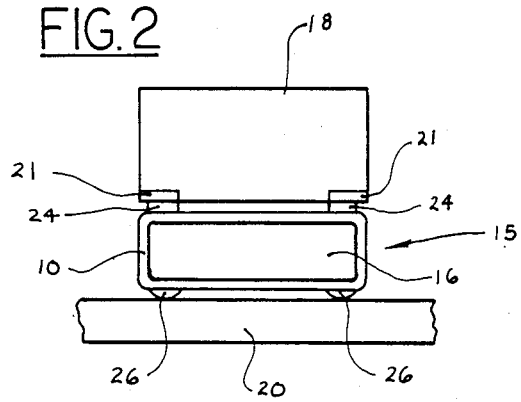
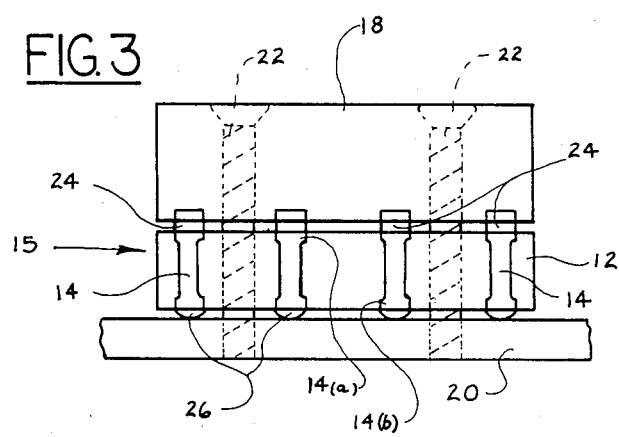
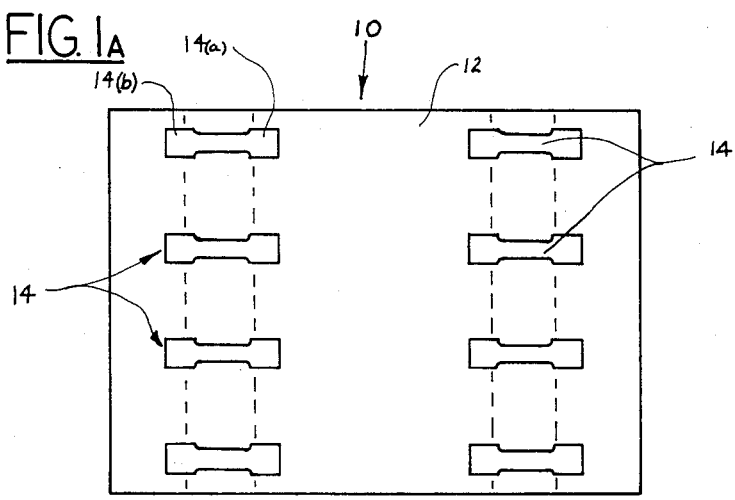

SOLDERLESS CONNECTION APPARATUS

BACKGROUND OF THE INVENTION

This invention relates to an apparatus for interconnecting electrical circuit devices. More particularly, this invention relates to a new and improved solderless connector element for establishing and maintaining electrical contact between circuit devices. This invention is particularly well suited for connecting leadless electronic packages to a circuit board without the use of solder.

A conventional method of interconnecting electrical or electronic circuit components consists of soldering terminals on the components to conductors which deliver current to or from the components. While generally suitable for its intended purposes, interconnecting electrical components via soldering terminals does suffer from certain drawbacks and deficiencies. For example, the substrate which support an exposed terminal must be able to withstand relatively high temperatures with no adverse effects. Also, a problem with soldered connections is the relative difficulty in disconnecting a soldered terminal during repairs and manufacturing. To effect disconnection, the solder must be reheated to its melt temperature.

In some applications it has been found desirable to replace soldering as a technique for use in establishing connections to flexible and other circuits. In these applications, the requisite electrical contact may be established by mechanically pressing the terminal portions of the circuit against terminal pads on the connector, device or another circuit. Such prior art pressure connections may be made with the aid of a solid resilient pressure applicator, such as an elastomeric member, which is placed in compression to bias at least one of the components to be electrically interconnected toward the other component to hold the terminal portions thereof in electrical contact. Such a solderless connection system is disclosed in U.S. Pat. No. 4,468,074 assigned to the assignee hereof and incorporated herein by reference.

While pressure connections of the type briefly described above facilitate circuit assembly and repair, and also allow for the use of low cost and low temperature plastics while eliminating the time consuming and thus costly step of soldering, the prior art pressure connectors have certain drawbacks and problems. For example, it is often desirable to affect a solderless connection between leadless electronic packages and circuit boards. Prior art solderless connector devices are typically not well suited for such an application.

SUMMARY OF THE INVENTION

The above-discussed and other problems of the prior art are overcome or alleviated by the solderless connector of the present invention. In accordance with the present invention, a solderless connector comprising a flexible circuit sheet wrapped about a compressive element to provide exposed contact pads for pressure connection between, for example, a leadless electronic package mounted on the top surface of the connector and a circuit board or the like mounted on the bottom surface of the connector. The electronic package, i.e., chip carrier or DIP package (modified to be leadless), could be held to the circuit board by any suitable mechanical means including a clamp or screws and the like.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGS.

FIG. 1A is a plan view of a flexible circuit sheet used in accordance with the solderless connector of the present invention;

FIG. 2 is an and end view of an electronic package mounted to a circuit board via the solderless connector of the present invention;

FIG. 3 is a side elevation view of the solderless connector shown in FIG. 2;

DESCRIPTION OF THE PREFERRED EMBODIMENT

Figure 4A:
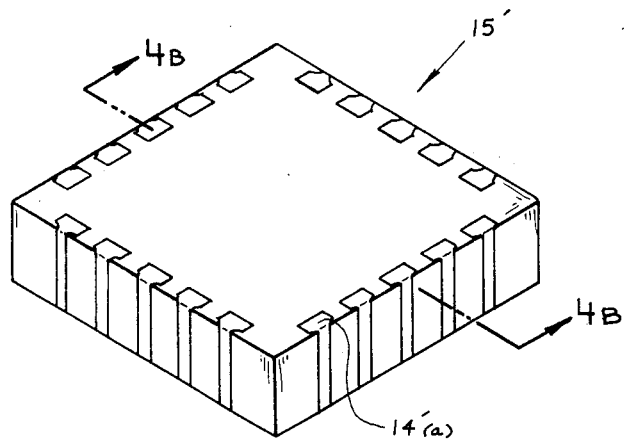
FIG. 4A is a perspective view of another embodiment of the solderless connector of the present invention.

Referring first to FIG. 1A, an unassembled flexible circuit sheet used in the solderless connector of the present invention is shown generally at 10. Flexible circuit sheet 10 includes a flexible substrate material 12 having a predetermined electrically conductive pattern 14 thereon. Circuit sheet 10 is designed to be folded or wrapped about a compressible element 16 (see FIG. 2) so as to form upper and lower surfaces which are capable of electrically communicating via the conductive pattern 14 thereby defining solderless connector 15. It will be appreciated that while conductive pattern 14 has been shown in a "dog-bone" shape having upper pads 14(a) and lower pads 14(b), any other suitable shape could also be used. Preferably, flexible circuit sheet 10 is folded along the fold lines which are indicated by the dotted lines in FIG. 1A.

As mentioned, compressible element 16 is encased within flexible circuit sheet 10 to form the solderless connector 15 of the present invention as shown in FIGS. 2 and 3. Preferably, compressible element 16 consists of an elastomeric foam such as polyurethane or silicon foam, the outside of which is provided with an appropriate adhesive to secure a strong attachment to circuit sheet 10. Preferably, the compressible element should not take on a set, yet be soft enough to minimize over compression and distortion.

Still referring to FIGS. 2 and 3, a leadless electronic package (DIP package) 18 is shown attached and electrically connected to a printed circuit board 20 via the solderless connector 15 of the present invention. Leadless DIP package 18 includes conductive contacts 21 which electrically contacts pads 14(a) on circuit trace 14. In turn, pads 14(a) are electrically connected to pads 14(b) which finally effect connection with the circuit pattern on circuit board 20. Thus, electrical connection between leadless electronic package 18 and circuit board 20 is provided by the flexible circuit 10/compressible element 16 assembly (solderless connector 15) of the present invention.

The electronic package 18 may be held down in compressive engagement to circuit board 20 by any well know means including a clamp or the like or suitable screws or bolts. In FIG. 3, hold-down screws are shown in phantom at 22. It will be appreciated that hold down screws or the like may necessitate redesign of the internal real-estate of the electronic package in order to accommodate the screw holes.

Figure 4B:
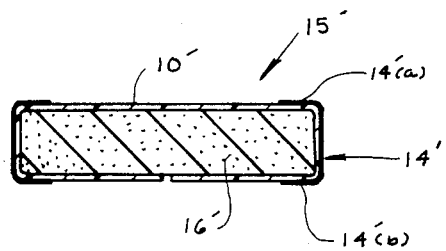
FIG. 4B is a cross-sectional elevation view along the line 4B—4B of FIG. 4A.
Figure 1B:
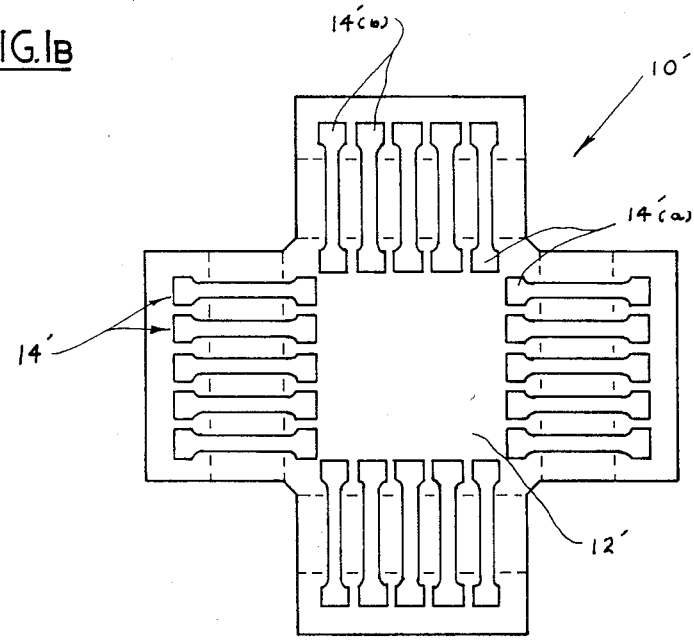
FIG. 1B is a plan view of another flexible circuit sheet used in accordance with the solderless connector of the present invention.

Referring now to FIG. 1B, another flexible circuit sheet 10' for use in accordance with the solderless connector of the present invention is shown. Flexible circuit sheet 10' includes a flexible substrate material 12' having a predetermined electrically conductive pattern 14' thereon. As in the embodiment shown in FIGS. 1, 2 and 3, circuit sheet 10' is designed to be folded or wrapped about a compressible element 16 as shown in FIGS. 4A and 4B so as to form upper and lower surfaces which are capable of electrically communicating via the conductive pattern 14' thereby defining solderless connector 15'. As in the previous embodiment, flexible circuit sheet 10' is preferably folded along the fold lines which are indicated by the dotted lines in FIG. 1B.

As mentioned above, the substantially rectangular solderless connector 15 of FIGS. 2 and 3 is especially well suited for interconnecting a circuit board with a leadless DIP component. However, in FIGS. 4A and 4B, solderless connector 15' has a substantially square configuration with circuit traces 14' provided along all four sides thereof (versus only along two sides in solderless connector 15). Thus, solderless connector 15' includes contact pads 14(a)' and 14(b)' which electrically interconnect the top and bottom surfaces thereof along all four sides. The configuration of solderless connector 15' makes it especially well adapted for connecting leadless chip carriers to a circuit device. It will be appreciated that the flexible circuit sheet 15, 15' and elastomeric element 16, 16' may be configured in any desired shape in accordance with the present invention so as to be tailored to interconnect a particular leadless electronic component.

In a preferred embodiment of the present invention, leadless electronic packages 18, 18' are connected to conductive patterns 14, 14' via reflow solder 24 to effect a strong, permanent connection. Also, preferably contact pads 26, 26' are provided to at least one portion of conductive patterns 14, 14' so as to insure accurate positioning and electrical contact with conductive patterns on the circuit board. For some applications, these contact pads may need gold dots to provide the electrical connections with structural integrity.

Alternatively, no solder is used between electronic packages 18, 18' and conductive pad 14(a), 14(a)' and/or conductive pad 14(b), 14(b)' and circuit board 20. Such a solderless connection provides easy and quick assembly and disassembly as well as reduced manufacturing time and costs.

As discussed above, the solderless connector of the present invention is especially well suited for effecting a strong, reliable electrical connection between leadless electronic packages and circuit boards or other electronic devices. Moreover, the solderless connector 15, 15' comprised of a compressible element 16, 16'/flexible circuit 10, 10' combination will provide sufficient conformability to effect secure mating with a circuit board or other electronic device.

The solderless connector of the present invention provides many features and advantages over prior art solder-type connectors. For example, assembly and disassembly from the circuit board is quicker and easier with the present invention due to the lack of semi-permanent solder connections. This ease of disassembly therefore, greatly aids in repair and other changes.

Another feature of this invention is that real-estate density on the circuit board may be desirably increased. Also, solderless contacts will not be undesirably brittle or prone to shock so as to induce failure. Other features and advantages, will be clear to those skilled in the art.

In accordance with the present invention, the material which defines the compressible element 16 of FIGS. 2, 3, 4A and 4B preferably consists of an open celled visco-elastic polymer and, in the preferred embodiment, a polyurethane foam. Particularly good results have been obtained employing a urethane formulation comprising a mixed polyester/polyether system. One open cell material suitable for use in the practice of the present invention is R/Flex 8770 obtainable from Rogers Corporation, Rogers, Conn. This material is characterized by compressive load deflection at 25% of compression in the range of 5 to 10 psi. A resilient material for use in the present invention is preferrably characterized by a compression set of less than 5%. The compression set is tested in accordance with ASTM standard D-1564 wherein a two inch square and one inch thick stack of sheets of material (about 60 mils/sheet) are compressed 50% to ½ inch thickness, the compressed material is subjected to 158° F. for 22 hours, the compression is released and the thickness is measured. The compression set of the R/Flex 8770 material after 5 hours of steam autoclaving prior to performing test ASTM D-1564 is less than 10%.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A solderless connector comprising:
   flexible circuit sheet means, said circuit sheet means including a nonconductive substrate having an electrically conductive pattern means thereon; and
   compressible element means;
   said flexible circuit sheet means being wrapped around and secured to said compressible element means to form a top surface and bottom surface, said conductive pattern means being adapted to electrically connect said top surface to said bottom surface.

2. The solderless connector of claim 1 including:
   contact pads located at selected locations on said conductive pattern means.

3. The solderless connector of claim 1 wherein said conductive pattern means is comprised of individual patterns having a dog-bone shape.

4. The solderless connector of claim 1 wherein:
   said flexible circuit sheet means is secured to said compressible element means by an adhesive material.

5. The solderless connector of claim 1 wherein:
   at least one of said top and bottom of said circuit sheet means is adapted to be mounted on a leadless electronic package.

6. The solderless connector of claim 5 wherein:
   said electronic package is a leadless DIP package.

7. The solderless connector of claim 5 wherein:

said electronic package is a chip carrier.

8. The solderless connector of claim 7 wherein:
said leadless electronic package is disposed on said circuit sheet means surface via reflow solder.

9. The solderless connector of claim 1 wherein:
at least one of the said top and bottom surface is adapted to be mounted on a circuit board.

10. The solderless connector of claim 9 including:
at least one contact pad being provided to at least one portion of said conductive pattern means, said contact pad being provided to the surface of said circuit sheet means which is adapted to be mounted on said circuit board.

11. The solderless connector of claim 9 including:
mechanical means for compressively securing said top and bottom surface to said circuit board.

12. The solderless connector of claim 11 wherein:
said mechanical means comprises clamp means.

13. The solderless connector of claim 11 wherein:
said mechanical means comprises screw means.

14. The solderless connector of claim 1 wherein:
said flexible circuit sheet means is substantially square; and
wherein said electrically conductive pattern means is disposed along all four sides of said square sheet means.

15. The solderless connector of claim 14 wherein:
said electronic package is a chip carrier.

16. The solderless connector of claim 1 wherein:
said flexible circuit sheet means is substantially rectangular; and
wherein said electrically conductive pattern means is oppositely disposed along at least two sides of said rectangular sheet means.

17. The solderless connector of claim 16 wherein:
at least one of said top and bottom of said circuit sheet means is adapted to be mounted on a leadless electronic package.

18. The solderless connector of claim 17 wherein:
said electronic package is a leadless DIP package.

* * * * *